(12) United States Patent
Ikeda

(10) Patent No.: US 8,319,529 B2
(45) Date of Patent: Nov. 27, 2012

(54) DRIVE CIRCUIT FOR A VOLTAGE CONTROL TRANSISTOR

(75) Inventor: Kentaro Ikeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 12/881,842

(22) Filed: Sep. 14, 2010

(65) Prior Publication Data

US 2011/0221480 A1    Sep. 15, 2011

(30) Foreign Application Priority Data

Mar. 10, 2010   (JP) ................................. 2010-053691

(51) Int. Cl.
*H03B 1/00* (2006.01)
*H03K 3/00* (2006.01)
(52) U.S. Cl. .................... 327/109; 327/108; 327/110
(58) Field of Classification Search .............. 327/108, 327/109, 110

See application file for complete search history.

(56) References Cited

U.S. PATENT DOCUMENTS

| | | | |
|---|---|---|---|
| 5,397,878 A | 3/1995 | Chen | |
| 5,548,240 A * | 8/1996 | Bayer | 327/432 |
| 6,441,673 B1 | 8/2002 | Zhang | |
| 7,459,945 B2 * | 12/2008 | Omura | 327/108 |
| 2010/0123485 A1 * | 5/2010 | Lee | 327/109 |

FOREIGN PATENT DOCUMENTS

| | | |
|---|---|---|
| JP | 3-286619 | 12/1991 |
| JP | 5-207730 | 8/1993 |
| JP | 11-298308 | 10/1999 |
| JP | 2998766 | 11/1999 |
| JP | 2000-022513 | 1/2000 |
| JP | 2008-42633 | 2/2008 |
| JP | 2008-235952 | 10/2008 |
| JP | 2009-55521 | 3/2009 |
| JP | 2009-218528 | 9/2009 |

OTHER PUBLICATIONS

U.S. Appl. No. 13/227,014, filed Sep. 7, 2011, Takada, et al.
U.S. Appl. No. 12/876,598, filed Sep. 7, 2010, Kentaro Ikeda, et al.
Japanese Office Action mailed Jan. 24, 2012, for Japanese Application No. 2010-053691, filed Mar. 10, 2010 (with English translation).
Office Action issued Jul. 10, 2012, in Japanese Patent Application No. 2010-053691 (with English-language Translation).

* cited by examiner

*Primary Examiner* — John Poos
(74) *Attorney, Agent, or Firm* — Oblon, Spivak, McClelland, Maier & Neustadt, L.L.P.

(57) ABSTRACT

A resonant gate drive circuits for a voltage controlled transistor according to the embodiments are characterized by connecting a resonant inductor and a resistor to a gate of the voltage controlled transistor or a gate of the normally-on voltage controlled transistor or a voltage control terminal of a pseudo normally-off element, in series, and providing the drive circuit with two complementary switching elements connected in series.

6 Claims, 12 Drawing Sheets

DRIVE CIRCUIT FOR A VOLTAGE CONTROL TRANSISTOR

CROSS-REFERENCE TO RELATED APPLICATION

This application is based upon and claims the benefit of priority from the prior Japanese Patent applications No. JP2010-053691, filed on Mar. 10, 2010; the entire contents of (all of) which are incorporated herein by reference.

FIELD

The embodiments described herein relate generally to a resonant gate drive circuit of a voltage controlled transistor switching element particularly for a normally-on operation.

BACKGROUND

A voltage controlled transistor such as MOSFET is used as a switching circuit for a power circuit. A digital circuit is sometimes used for controlling the voltage controlled transistor; generally the standard voltage of the digital circuit is about 5 V, but with advance in voltage reduction, some control circuits have the standard voltage of about 3 V. Therefore, an element having a threshold voltage of 5 V or more in a voltage controlled transistor has to be provided with a power source separately from a power source of the control circuit; even if the threshold voltage is 5 V or less, when the threshold voltage is close to the control circuit voltage, a charging speed for an input capacity of a gate goes down, hence to disadvantageously delay the switching speed. Further, a wide gap semiconductor described later includes a normally-on element and in order to switch off the element, a negative power source must be prepared.

In a circuit using switching, power loss varies depending on a transition speed of turning on/off of a voltage controlled transistor. The higher transition speed of a voltage controlled transistor is more preferable; for that purpose, it is necessary to control a gate voltage of the voltage controlled transistor speedily. In this respect, various kinds of resonant gate drive circuits have been proposed.

The conventional means so far known, however, cannot drive the voltage controlled transistor having a higher threshold voltage than that of a drive circuit with a single power source nor a normally-off element without using a negative power source, and further the conventional means is defective in a simple structure because it needs many switches for a drive circuit in order to restrain such a gate voltage caused by resonance that breaks down the voltage controlled transistor, with a complicated sequence of the drive circuit and with the increasing number of components forming the circuit.

A wide gap semiconductor of GaN, SiC, diamond, and the like is characterized by a superiority over that of Si in the important points of a semiconductor device such as dielectric breakdown voltage, electron mobility, and thermal conductivity. An AlGaN/GaN hetero HEMT, that is one of the GaN semiconductor devices, has attracted much attention and expectation, as it has high frequency property and low on-resistance property because of having a high electron mobility and carrier density. The HEMT or SiC transistor having the AlGaN/GaN hetero-structure has a property (normally-on) of flowing current when a gate voltage is not applied; therefore, in order to turn off the element or to stop the current, a negative voltage must be applied to the gate. Therefore, a negative power source is required; as the result, the number of the components for a circuit is increased and the wiring on a circuit substrate gets complicated.

As a circuit which saves the negative power source, such a method can be considered that a control signal is supplied to a gate of HEMT through a capacitor from a transmitter, and that a diode is arranged between the capacitor and the source of HEMT, to save the negative power source. This method, however, needs a diode and a capacitor having a large capacity 10 to 500 times more than the input capacity of the voltage controlled transistor externally, in addition to a semiconductor device; therefore the capacitor occupies a large volume on a substrate.

Alternatively, the drive circuit may be formed on the same chip as a semiconductor device of a single element. This, however, also needs a capacitor having a large capacity, which makes it difficult to design the above. Further, voltage oscillation (ringing) may occur due to the resultant parasitic inductance from the wiring from a drive circuit of a switching element to a gate of the switching element getting longer.

DETAILED DESCRIPTION

Figure 1:
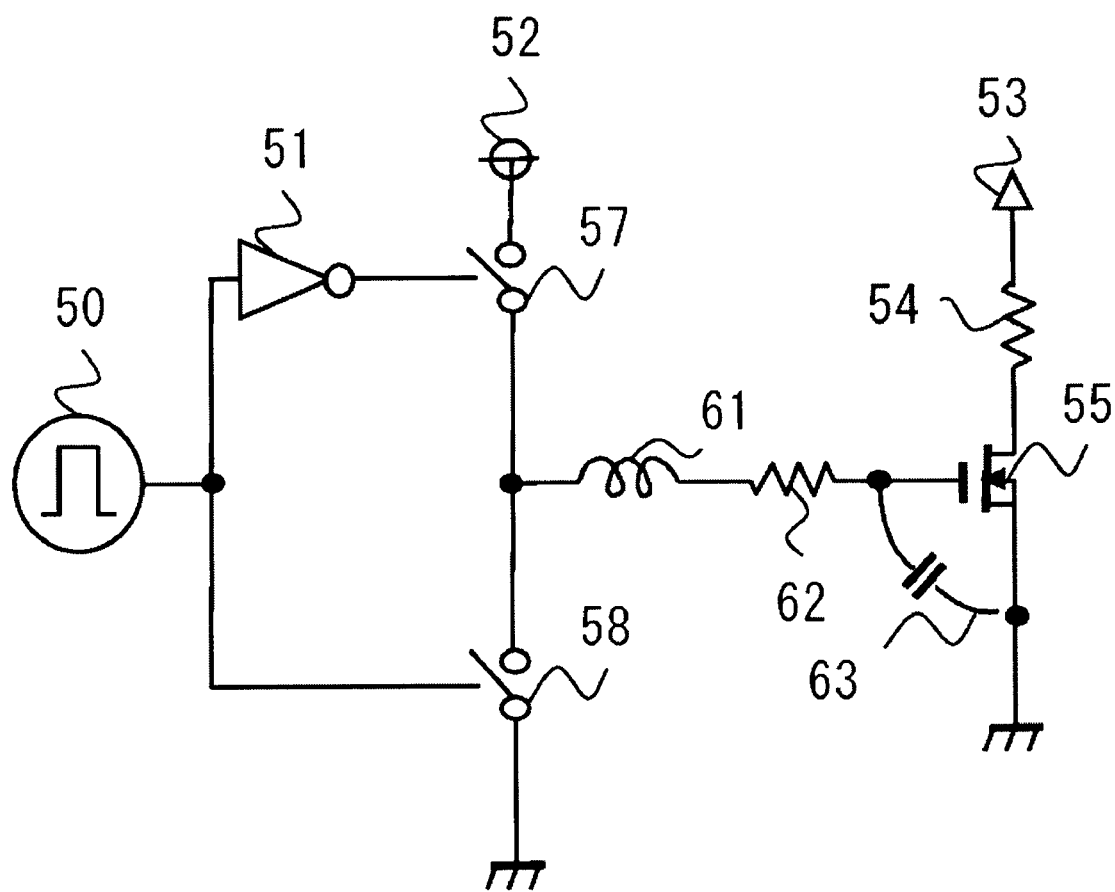
FIG. 1 is a circuit diagram of a drive circuit according to a first embodiment.

As mentioned above, when a threshold voltage of a voltage controlled transistor to be driven is out of the range of a drive signal which a drive circuit can supply, the following disadvantages are found that: driving is impossible and even when the driving is logically possible by using resonance, the resonance voltage may get excessive; the sequence gets complicated; a plurality of special components are necessary; a clamp voltage gets unstable; and a protective circuit is short of reliability.

A normally-on voltage controlled transistor needs a large capacity of a capacitor required for driving it with a single power source and therefore, the capacitor occupies a large area on a substrate, which causes a disadvantage on the design of a substrate and generation of ringing because the wiring length gets longer. A large capacitor becomes a burden on one-chip integration.

In this regard, there is a demand for a drive circuit suitable for a switchable element (hereinafter, referred to a pseudo normally-off element) which does not require any negative power source but is formed in a single body of a semiconductor device, with a capacitor of a smaller capacity provided on the same chip. Further, there is a demand for a drive circuit capable of driving a voltage controlled transistor having a threshold voltage out of the range of a drive circuit voltage while restraining so much voltage causing a breakdown of the voltage controlled transistor, without using any special components and in a simple circuit structure having small amount of components.

In order to solve the above problems, a resonant gate drive circuit for a voltage controlled transistor is characterized by connecting a resonant inductor and a resistor to a gate of the voltage controlled transistor or a gate of the normally-on voltage controlled transistor or a voltage control terminal of a pseudo normally-off element, in series, and providing the drive circuit with two complementary switching elements connected in series.

This drive circuit can drive a voltage controlled transistor having a threshold voltage out of the range of the power source voltage of the drive circuit. Namely, it can drive a voltage controlled transistor having a higher threshold voltage than the range of the power source voltage of the drive circuit and drive a normally-on voltage controlled transistor with a single power source without using a negative voltage.

Further, it is characterized in that the voltage controlled transistor is of the normally-on type, a capacitor is provided with one electrode connected to the gate of the normally-on voltage controlled transistor and the other electrode connected to the resistor, and a third diode is provided with an anode connected to the gate of the normally-on voltage controlled transistor and a cathode of the third diode connected to the source of the normally-on voltage controlled transistor. According to this, it can drive the normally-on voltage controlled transistor and also it can do with a capacitor having a smaller capacity than that of the capacitor of a conventional art.

The drive circuit generates an LCR series resonant phenomenon with the input capacity of the various kinds of voltage controlled transistors, to generate a higher voltage than the drive circuit voltage or a negative voltage, and therefore it can drive a voltage controlled transistor having a threshold voltage out of the range of the power source voltage of the drive circuit. Namely, it can drive a voltage controlled transistor having a higher threshold voltage than the range of the power source voltage of the drive circuit and drive a normally-on voltage controlled transistor with a single power source without using a negative voltage.

Further, according to this drive circuit, since a larger amplitude than the power source voltage range of the drive circuit can be applied to a control terminal through resonance, the capacitor which required a large capacity for the drive circuit for the conventional normally-on voltage controlled transistor can be extremely reduced. According to the effect, when the drive circuit of the embodiment is used for the pseudo normally-off element, the capacitor provided on the chip of the pseudo normally-off element can be reduced, thereby making the design and the production of the pseudo normally-off element very easy and expanding the application range of the pseudo normally-off element. Further, ringing can be controlled because the circuit substrate is formed in compact and the wiring length is shortened.

As mentioned above, the resonant gate drive circuit for the voltage controlled transistor is characterized by connecting the resonant inductor and the resistor to the gate of the voltage controlled transistor or the gate of the normally-on voltage controlled transistor or the voltage control terminal of the pseudo normally-off element, in series, and providing the drive circuit with two complementary switching elements connected in series.

According to this, the drive circuit can drive a voltage controlled transistor having a threshold voltage out of the range of the power source voltage of the drive circuit. Namely, it can drive a voltage controlled transistor having a higher threshold voltage than the range of the power source voltage of the drive circuit and drive a normally-on voltage controlled transistor with a single power source without using a negative voltage.

Further, it is characterized in that the voltage controlled transistor is of the normally-on type, a capacitor is provided with one electrode connected to the gate of the normally-on voltage controlled transistor and the other electrode connected to the resistor, and a third diode is provided with an anode connected to the gate of the normally-on voltage controlled transistor and a cathode of the third diode connected to the source of the normally-on voltage controlled transistor. According to this, it can drive the normally-on voltage controlled transistor and also it can do with a capacitor having a smaller capacity than that of the capacitor of a conventional art.

Further, a first switching element and a second switching element are alternatively turned on/off with proper dead times, hence to improve the stability of the drive circuit.

Further, when the capacitor is provided on the gate drawing electrode, a necessary capacity of the capacitor can be easily formed.

When the capacity of the capacitor is restrictive, a semiconductor device can be easily designed.

Hereinafter, the embodiments will be described in details using the attached drawings.

First Embodiment

A circuit shown in FIG. 1 is a drive circuit for driving a voltage controlled transistor 55 having a threshold voltage out of the range of power source voltage of the drive circuit. Switching elements 57 and 58 may be N-type transistors or P-type transistors but are not restricted to these as far as they are provided with switching functions. The switching element 57 is connected to a drive circuit power source and the switching element 58 is connected to the ground. The switching elements 57 and 58 are controlled with proper dead times so as to be alternatively turned on/off in a way of preventing the both switching elements from turning on simultaneously. A resonant inductor 61 is connected to a junction of the first and second switching elements, a resistor 62 is connected to the resonant inductor 61 in series, and the resistor 62 is connected to the voltage controlled transistor 55.

The drive circuit shown in FIG. 1 having the above structure forms an LCR resonant circuit by an LCR series circuit which is formed by the resonant inductor 61, the resistor 62, and the input capacity 63 of the voltage controlled transistor 55. When a capacity of the capacitance is defined as C, an inductance of the resonant inductor is defined as L, a resistance is defined as R, and an input voltage is defined as V in the LCR resonant circuit, the value Q is expressed as the following equation 1. The value Q is referred to as a voltage magnification factor, and when a resonance occurs, a voltage Q times more than the input voltage V is generated. When a speed of the resonance is defined as a constant angular speed $\omega$, it is expressed by the following equation 2. By measuring the input capacity C of the voltage controlled transistor 55 in advance in the drive circuit according to the embodiment, the rising speed of a gate voltage can be freely designed according to the adjustment of the inductance from the following equation 2, and by deciding R according to a gate voltage desired by a designer from the following equation 1, it is possible to generate a higher voltage than the drive circuit voltage in safe, without breaking down the voltage controlled transistor due to the generation of the excessive voltage caused by the resonance.

$$Q = \frac{1}{R}\sqrt{\frac{L}{C}} \qquad \text{[Equation 1]}$$

$$\omega = \frac{1}{\sqrt{LC}} \qquad \text{[Equation 2]}$$

Figure 2:
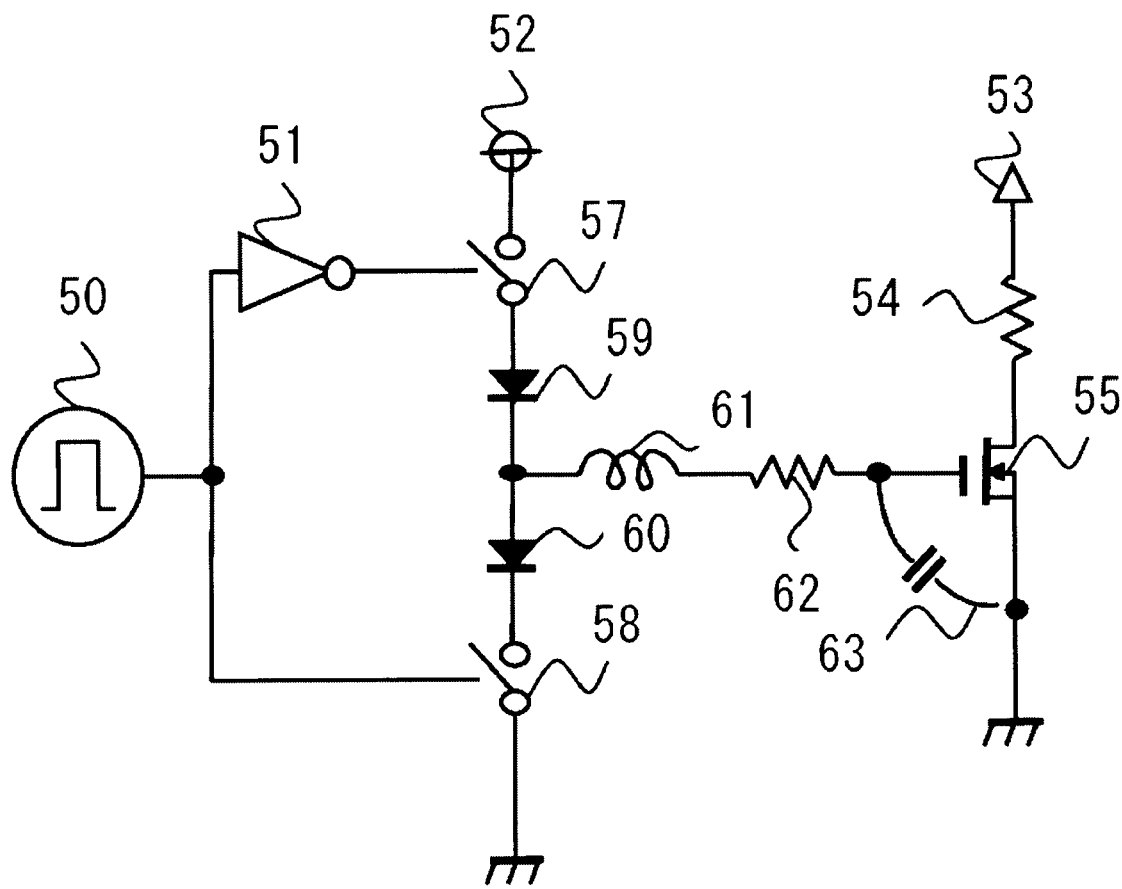
FIG. 2 is a modification of the circuit diagram of the drive circuit according to the first embodiment.

In the embodiment of FIG. 1, the first and the second switching elements are directly connected in series; while diodes 59 and 60 may be connected in series between the switching element 57 and the switching element 58 in the normal direction from a high side to a low side. As illustrated in FIG. 2, the resonant inductor 61 is connected to the cathode of the diode 59 and the anode of the diode 60, the resistor 62 is connected to the resonant inductor 61 in series, and the resistor 62 is connected to the voltage controlled transistor 55.

This circuit can avoid such a defect of making a gate voltage of the voltage controlled transistor 55 unstable that when MOSFETs, generally used as switching elements, are used as the switching elements 57 and 58, a current reversely flows into the power source voltage 52 or reversely flows from the ground because of having body diodes in the MOSFETs.

Figure 8:
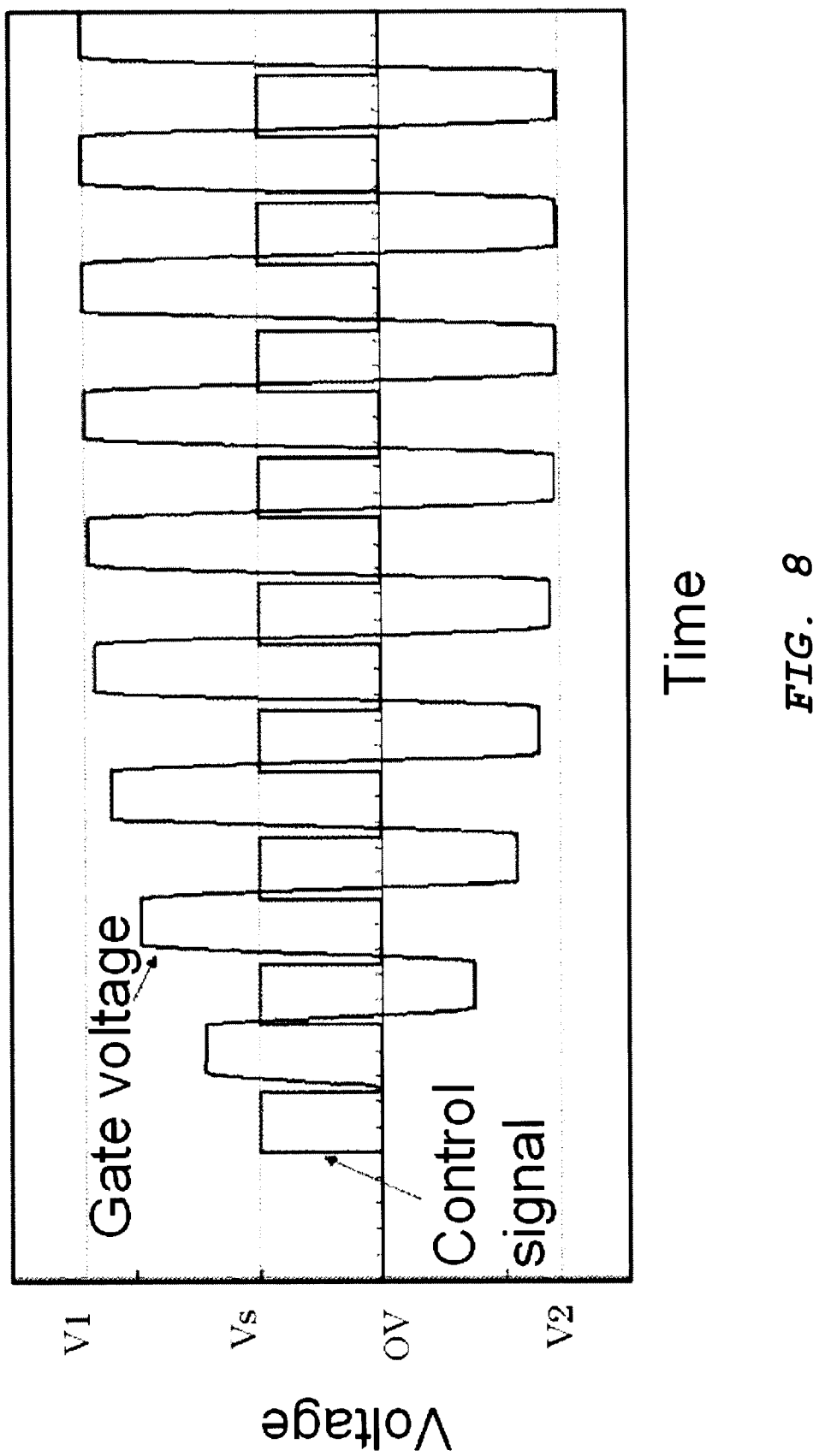
FIG. 8 is a view of a control signal and a change in a gate voltage according to the first embodiment.

FIG. 8 is a view showing a control signal 50 and a gate voltage of the voltage controlled transistor shown in FIG. 2. When the control signal is at a low level, the switching element 57 is turned on, while the switching element 58 is turned off. When the control signal is at a high level, the switching element 58 is turned on, while the switching element 57 is turned off. Here, the drive circuit voltage is supposed to be equal to a high level voltage Vs of the control signal. When a control signal is entered, a gate voltage gets higher than the drive circuit voltage Vs due to the resonance phenomenon, and in the end, it settles at the high level voltage V1 and the low level voltage V2. This is because the constant of the LCR resonant circuit is optimized and therefore a gate voltage more than double the drive circuit voltage Vs appears stably; unless the resistor 62 that is a component element of the embodiment, is provided according to the equation 1, excessive voltage will be generated in a gate, so that the voltage controlled transistor 55 may be broken.

Figure 7:
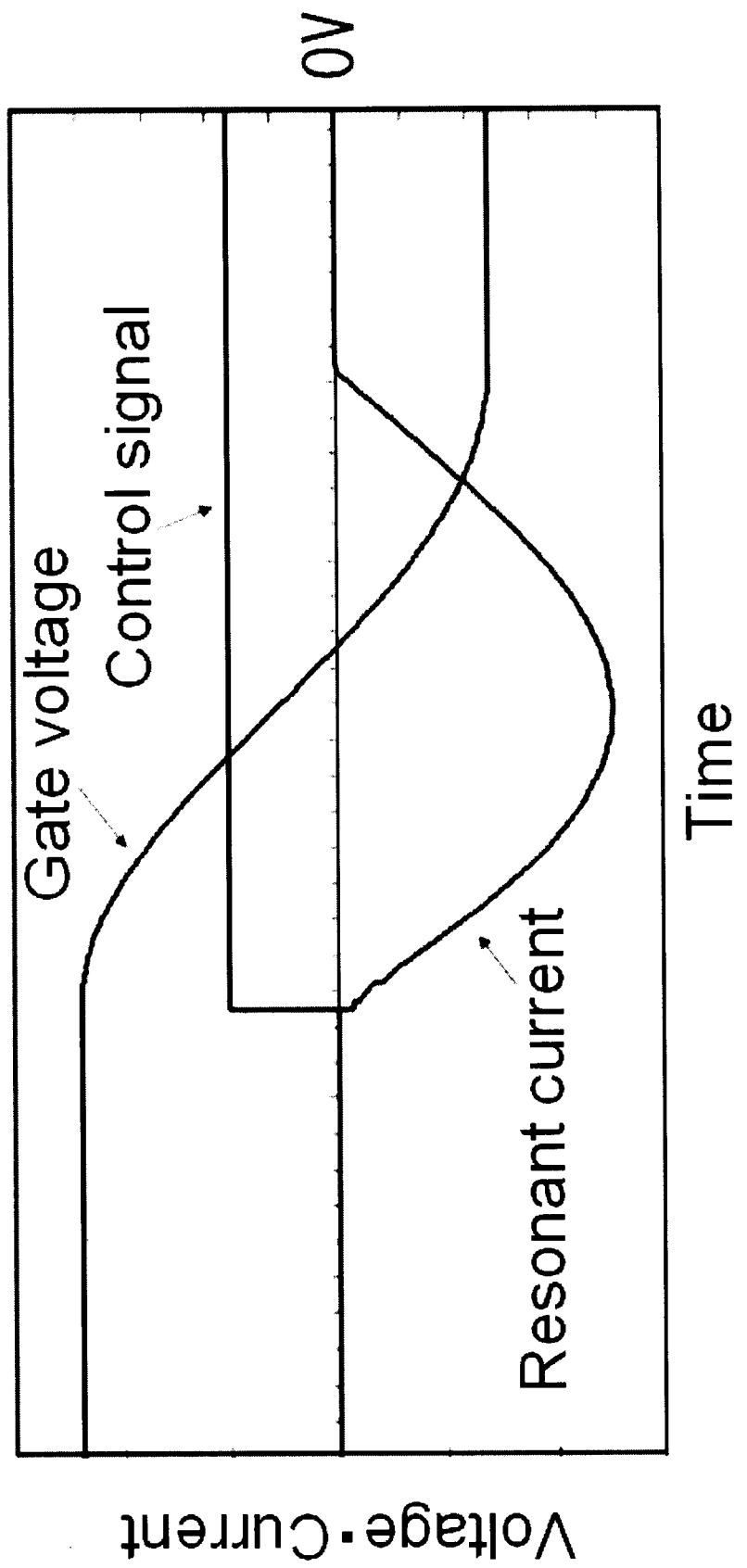
FIG. 7 is a view showing a change in a resonant current and a gate voltage at switching a control signal.

FIG. 7 shows a resonant current, a control signal, and a gate voltage at an instant in FIG. 8. At first, the gate voltage is at a high level; when the control signal gets high, the switching element 57 is turned off and the switching element 58 is turned on; then current flows from the gate of the voltage controlled transistor 55 to the ground through the resistor 62, the resonant inductor 61, the diode 60, and the switching element 58. After a while, the resonant current begins reducing; however, because of the property of the inductor, a current does not stop instantly but the current flows even when the gate voltage goes to the ground level, and the gate voltage becomes negative. The resonant current stops and gets stable at a level of the negative voltage. Because of having the diode 60, a reverse current after the resonant current is lost can be inhibited, so that the gate voltage gets stable without oscillation. FIG. 7 shows a phenomenon at a transition of the control signal from a low level to a high level; even at a transition from a high level to a low level, the same phenomenon occurs just with the reverse signs on the current and voltage. Thus, it can keep a stable voltage control without oscillation at a high level voltage and a low level voltage and therefore, a duty ratio control is also possible.

According to the above principle, the drive circuit shown in FIGS. 1 and 2 induces an LCR series resonance phenomenon, to generate a higher voltage than the drive circuit voltage or a negative voltage, hence to make it possible to drive a voltage controlled transistor having a threshold voltage out of the power source voltage range of the drive circuit. Namely, it is enabled to drive a voltage controlled transistor which has a threshold voltage higher than the range of the power source voltage of the drive circuit and to drive a normally-on voltage controlled transistor with a single power source without using a negative voltage.

Second Embodiment

Figure 3:
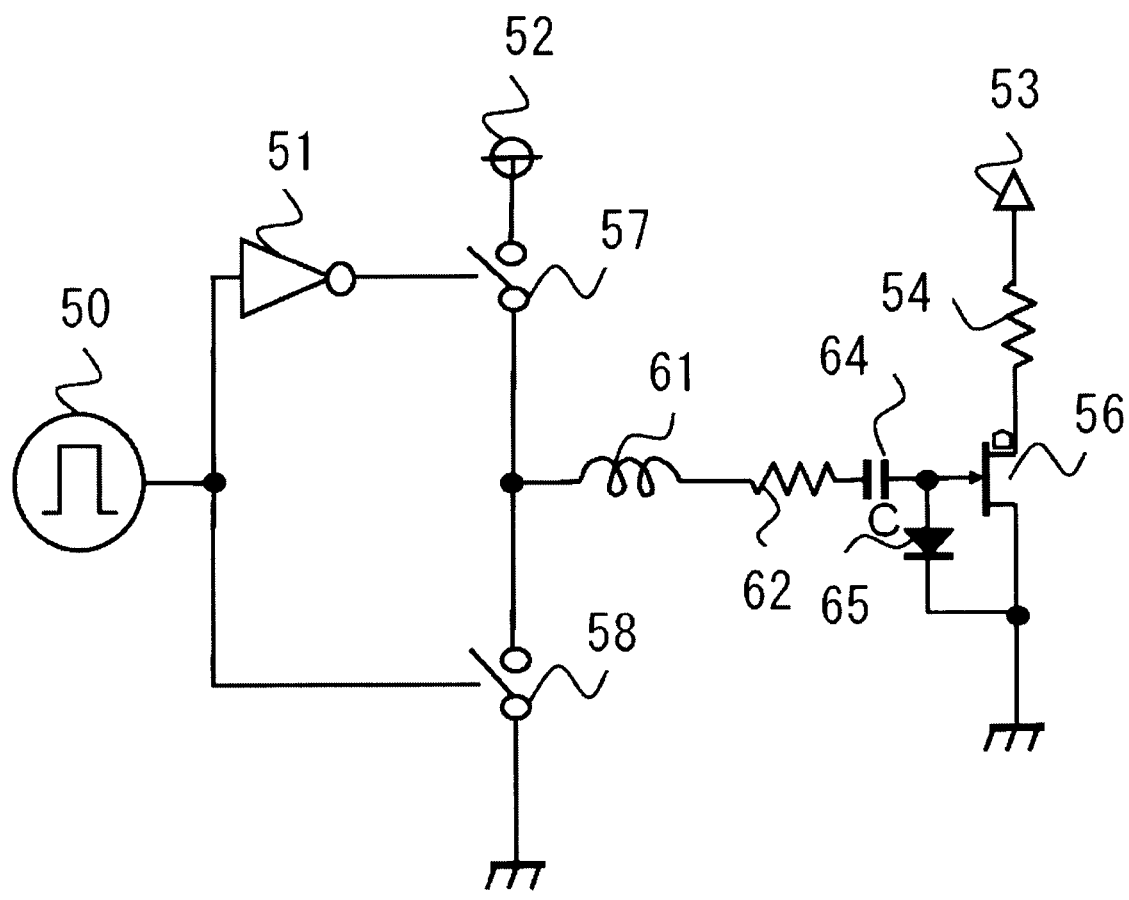
FIG. 3 is a circuit diagram of a drive circuit according to a second embodiment.
Figure 4:
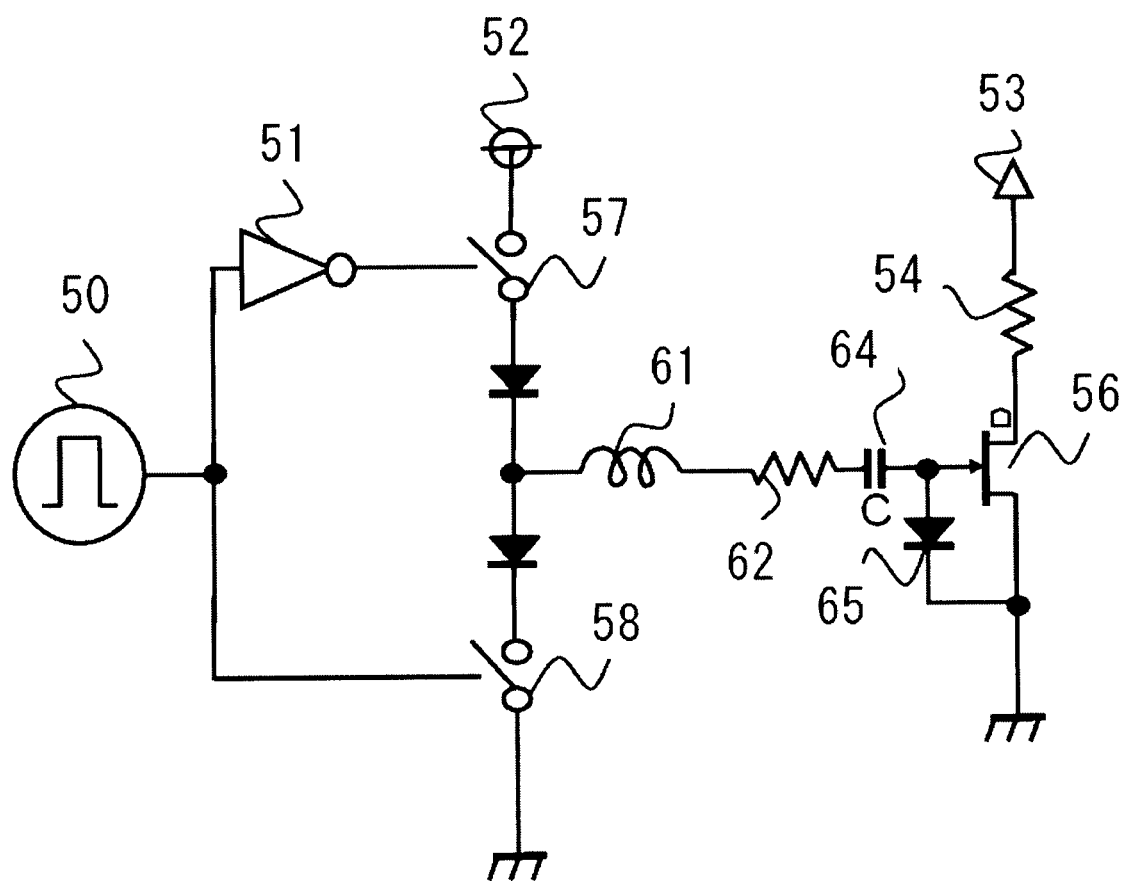
FIG. 4 is a modification of the circuit diagram of the drive circuit according to the second embodiment.

A circuit shown in FIG. 3 is a drive circuit for driving a normally-on voltage controlled transistor. Although the drive circuit shown in FIG. 1 also can drive a normally-on voltage controlled transistor, the normally-on voltage controlled transistor is sometimes defective in a positive gate voltage and in this regard, the drive circuit of FIG. 1 is not preferable. The drive circuit shown in FIG. 3 is a drive circuit which works well without adding excessive positive bias. The normally-on voltage controlled transistor 56 is used for the resonant gate drive circuit shown in FIG. 1, a capacitor 64 is connected in series between the gate of the normally-on voltage controlled transistor 56 and the resistor 62, with its anode connected to the gate of the normally-on voltage controlled transistor 56 and its cathode connected to the source of the normally-on voltage controlled transistor 56. According to the drive circuit, the normally-on element can be driven with the single power source. The circuit is realized by the capacitor 64, the normally-on voltage controlled transistor 56, and the diode 65. Since the capacitor 64 and the input capacity of the normally-on voltage controlled transistor 56 are in series, when a voltage is applied to the capacitor 64, a voltage divided by the capacity of the capacitor 64 and the input capacity of the normally-on voltage controlled transistor 56 is generated in the gate of the normally-on voltage controlled transistor 56. The diode 65, however, clips a high level of the gate voltage of the normally-on voltage controlled transistor 56. As the result, the operational center point of the gate of the normally-on voltage controlled transistor 56 is shifted to the side of a negative voltage. Therefore, when an alternative voltage is applied to the capacitor 64, a swing width obtained by dividing the alternative voltage width by the ratio of the capacitor 64 and the input capacity of the normally-on voltage controlled transistor 56 is generated in the gate of the normally-on voltage controlled transistor 56. According to this, the normally-on voltage controlled transistor can be driven with a single power source. Since the input capacity also exists in the normally-on voltage controlled transistor 56, when the normally-on voltage controlled transistor 56 is viewed from the resonant inductor 61, the capacitor 64 and the input capacity of the normally-on voltage controlled transistor 56 seem to be connected in series before the resistor 62, thereby forming an LCR series resonant circuit. According to the above drive circuit, a voltage oscillates much more than the voltage range where the drive circuit can output between the resistor 62 and the capacitor 64. Therefore, even when the capacity of the capacitor 64 is reduced and the voltage generated in the gate of the normally-on voltage controlled transistor 56 is reduced by the voltage division with the input capacity of the normally-on voltage controlled transistor 56, it can be compensated enough. Thus, the capacity of the capacitor 64 can be reduced.

Figure 9:
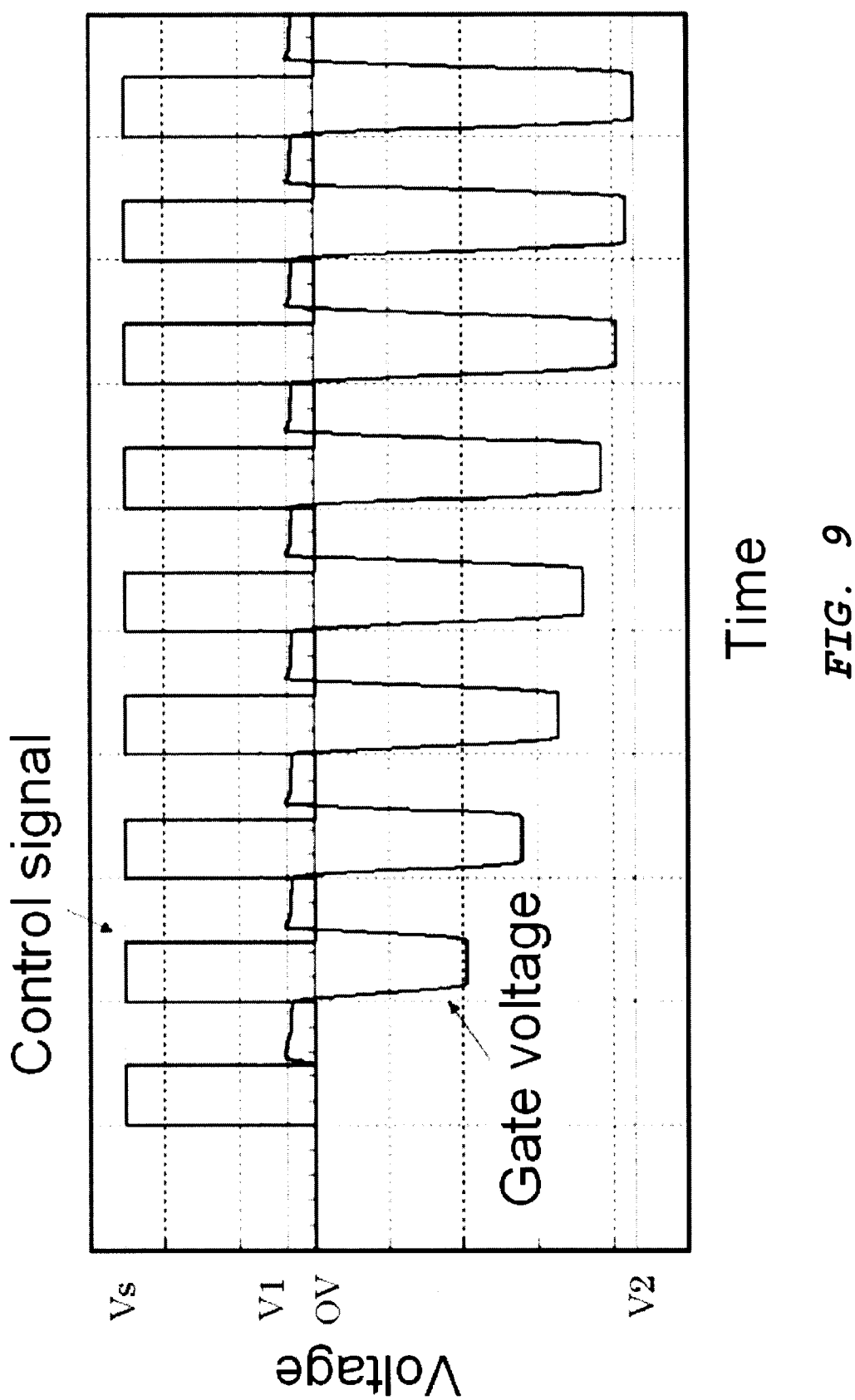
FIG. 9 is a view of a control signal and a change in a gate voltage according to the second embodiment.

FIG. 9 is a view showing an operation when the input capacity of the normally-on voltage controlled transistor 56 is equal to the capacity of the capacitor 64, and it shows the control signal 50 and a gate voltage of the voltage controlled transistor shown in FIG. 3. In spite of the drive circuit with a single power source, a negative voltage V2 is generated in the gate of the normally-on voltage controlled transistor 56 and a voltage V1 in the vicinity of 0 V is generated at a high level. According to this, it is found that the normally-on voltage controlled transistor can be also driven. The conventional drive circuit generates only just −Vs/2 voltage divided with a ratio of the capacitor 64 and the input capacity of the normally-on voltage controlled transistor 56; however, the drive circuit according to the embodiment can generate a negative voltage having a larger absolute value than the drive circuit voltage Vs. Therefore, the capacitor having a large capacity of a conventional art can be reduced. When the capacity of the capacitor can be reduced, large wiring is not necessary, which restrains the ringing.

In the above embodiment, similarly to the case of FIG. 1, reverse current blocking diodes 59 and 60 can be connected in series between the first and the second switching elements.

Third Embodiment

Figure 10A:
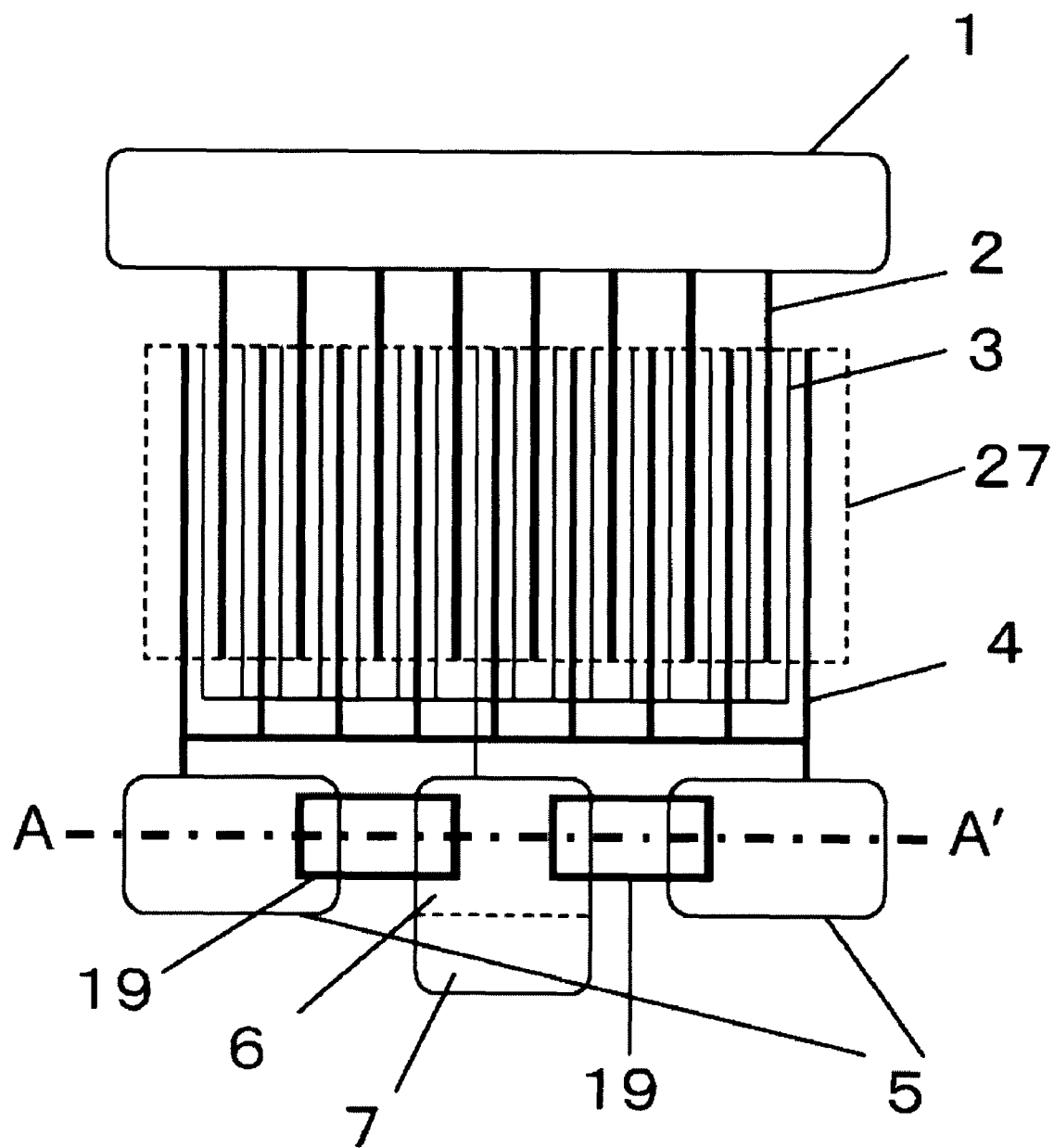
FIG. 10A is a view showing an example of a pseudo normally-off element used for the embodiment.
Figure 10B:
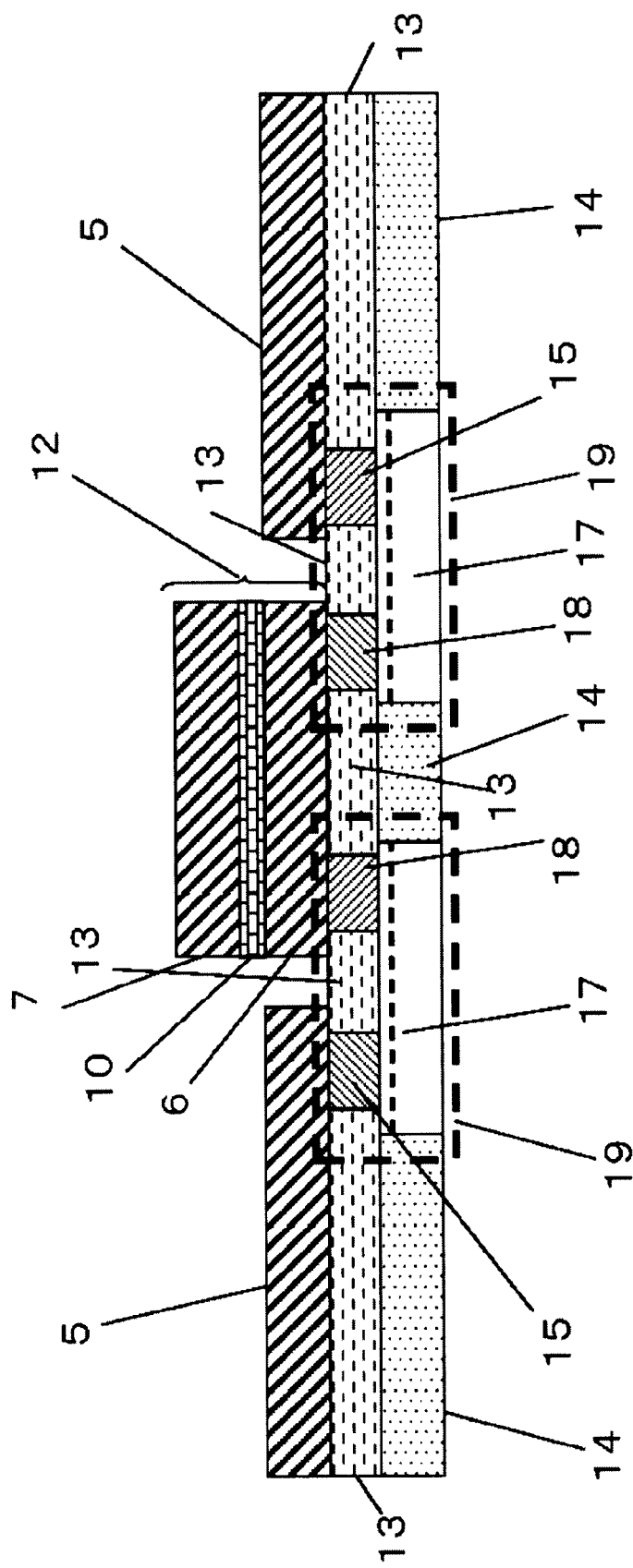
FIG. 10B is a cross-sectional view of FIG. 10A.

Recently, a single pseudo normally-off element has been tried with the capacitor 64, the diode 65, and the normally-on voltage controlled transistor 56 of FIG. 3 formed on the same chip. The semiconductor device described in FIG. 10A is a semiconductor device to exploit the feature of this patent that the capacity of the capacitor 64 can be reduced. FIG. 10B is a cross-sectional view taken along the straight line AA' in FIG. 10A.

The semiconductor device is formed by FET 27, a drain electrode pad 1 of the FET, source electrode pads 5 of the FET, a bonding gate electrode pad 7, a capacitor electrode 6, and diodes 19 respectively formed between the capacitor electrode 6 and the respective source electrode pads 5. Under the bonding gate pad 7, a dielectric insulating film 10 is formed, to electrically insulate the capacitor electrode 6 and the bonding gate electrode pad 7, thereby forming a capacitor 12. The dielectric insulating film may be formed of $SiO_2$, SiN, $Al_2O_3$, $TiO_2$, $BaTiO_3$, $SrTiO_3$, (Ba, Sr) $TiO_3$, $Ta_2O_5$, $LiTaO_3$, $HfO_2$, $ZrO_2$, and the like. The gate capacitor electrode 6 is electrically connected to the gate electrodes 3. The drain electrodes 2 and the drain electrode pad 1 are electrically connected to each other, and the source electrodes 4 and the source electrode pad 5 are electrically connected to each other. The diode 19 is formed by an anode electrode 18 which forms a shottky contact with a nitride semiconductor 17, a cathode electrode 15 which forms an ohmic contact with the nitride semiconductor 17, and the nitride semiconductor 17. The anode electrodes 18 and the capacitor electrode 6 are electrically connected to each other, and the cathode electrodes 15 and the source electrode pad 5 are electrically connected to each other. The source electrode pad 5 is insulated by an interlayer insulating film 13. The source electrode pad 5 has only to be insulated from the nitride semiconductor, except for the diode; for example, when the nitride semiconductor is insulated by isolation, the interlayer insulating film 13 can be saved. The FET and the nitride semiconductor except for the diode are isolated and insulated from each other. The isolation can be achieved by mesa through etching or ion injection.

Figure 11:
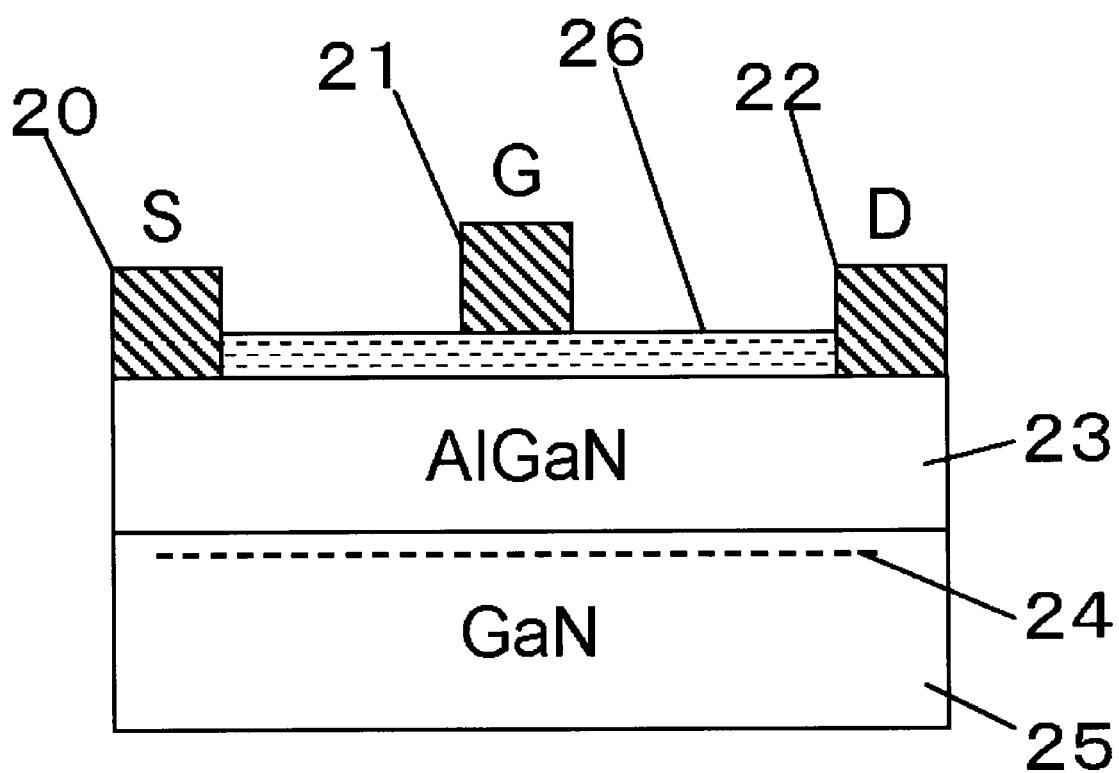
FIG. 11 is a view showing an example of a nitride semiconductor HEMT.

FIG. 11 is a cross-sectional view of an example of the normally-on FET 27 formed by the nitride semiconductor. The FET of FIG. 10 is formed by the nitride semiconductor shown in FIG. 11. An AlGaN layer 23 is stacked on a GaN layer 25, and the source electrode 20 and the drain electrode 22 are formed on the AlGaN layer 23. A gate insulating film 26 is formed on the AlGaN layer 23 and the gate electrode 21 is formed on the gate insulating film 26. The gate insulating film 26 may be formed of $SiO_2$, SiN, $Al_2O_3$, $TiO_2$, $Ta_2O_5$, $HfO_2$, $ZrO_2$, and the like. The gate insulating film 26 can restrain a gate leak current. A two dimensional electron gas 24 generated by the gate electrode 21 and the heterojunction of the GaN layer 25 and the AlGaN layer 23 is controlled by the gate electrode 21, to perform an operation as a transistor. In the embodiment, the normally-on element such as HEMT using the heterojunction is used for the FET. Although this embodiment uses the nitride semiconductor with the AlGaN layer 23 stacked on the GaN layer 25, a material of a combination of AlGaN, InAlN, GaN, and AlGaN in any ratio may be used for a semiconductor. Not only the heterojunction but also a superlattice structure, a structure having a plurality of heterojunctions, and a structure having an inclined composition will do as far as the nitride semiconductor can operate as a FET; namely, the structure is not restricted to that of FIG. 11. The FET 27 has a plurality of normally-on FETs shown in FIG. 11 connected in parallel.

This embodiment is suitable for these pseudo normally-off elements. The pseudo normally-off elements cannot be formed large because the capacity of the capacitor 64 is formed on the chip; in this embodiment, however, since a signal of a large voltage width can be applied to the pseudo normally-off element, it has an advantage that the capacity of the capacitor 64 on the chip of the pseudo normally-off element does not have to be made large.

Fourth Embodiment

Figure 5:
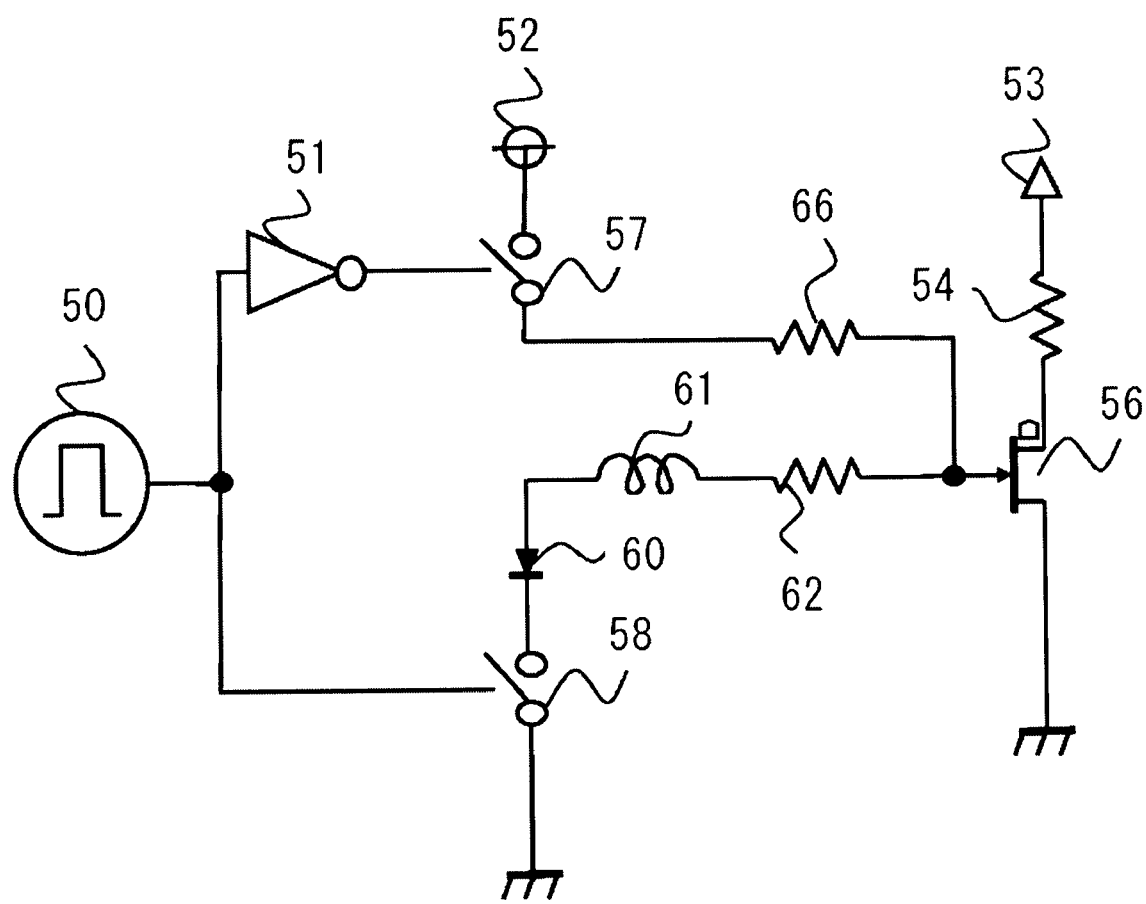
FIG. 5 is a circuit diagram of a drive circuit according to a fourth embodiment.

A drive circuit according to a fourth embodiment will be described using FIG. 5. The fourth embodiment is different from the first embodiment in that the diode 59 is deleted from the circuit of FIG. 2 of the first embodiment and that a resistor 66 is connected between the switching element 57 and the gate of the voltage controlled transistor 56. The resistor 66 is a resistor for controlling a current. According to the structure, resonance occurs only when electric charges are drawn out from the gate. Therefore, the gate voltage of the voltage controlled transistor 56 at a high level becomes equal to the voltage of the drive circuit power source 52 and that one at a low level becomes a negative voltage. Thus, the normally-on voltage controlled transistor can be driven with a single power source. Different from the first embodiment, a resistor that is a more general component can be used instead of a diode. Alternatively, the resistor 66 may be omitted, or the resistor 62 may be used instead of the resistor 66 by connecting the switching element 57 between the resonant inductor 61 and the resistor 62. Here, since the resonance occurs only in the direction of drawing out electric charges from the gate, it works a little different from the LCR resonant circuit according to the first embodiment and will not supply such a voltage that is simply calculated according to the value Q.

Fifth Embodiment

Figure 6:
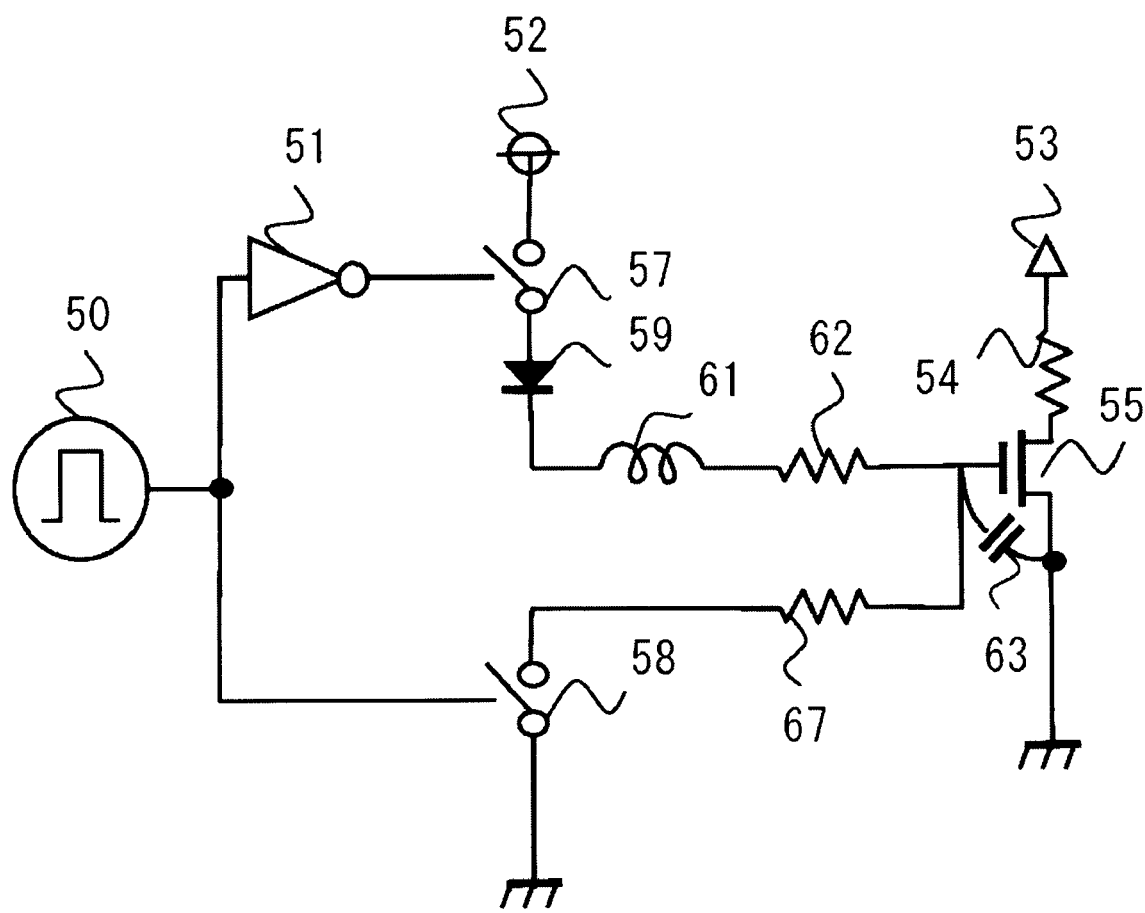
FIG. 6 is a circuit diagram of a drive circuit according to a fifth embodiment.

A drive circuit according to a fifth embodiment will be described using FIG. 6. The fifth embodiment is different from the first embodiment in that the diode 60 is deleted from the circuit of FIG. 2 and that a resistor 67 is connected between the switching element 58 and the gate of the voltage controlled transistor 55. The resistor 67 is a resistor for controlling a current. According to this structure, resonance occurs only when electric charges are injected into the gate. Therefore, the gate voltage of the voltage controlled transistor 55 at a low level becomes equal to the voltage at a low level of the drive circuit (namely, a ground level) and the gate voltage at a high level gets higher than the voltage of the drive circuit power source 52. This helps to drive a voltage controlled transistor which has a threshold voltage out of the range of the power source voltage of the drive circuit. Different from the first embodiment, a resistor that is a more general component can be used instead of a diode. Alternatively, the resistor 67 may be omitted, or the resistor 62 may be used instead of the resistor 67 by connecting the switching element 58 between the resonant inductor 61 and the resistor 62. Here, since the resonance occurs only in the direction of injecting electric charges from the gate, it works a little different from the LCR resonant circuit according to the first embodiment and will not supply such a voltage that is simply calculated according to the value Q.

Sixth Embodiment

The first embodiment assumes the case where the threshold voltage of the voltage controlled transistor is out of the range of the power source voltage of the drive circuit. However, even when the threshold voltage of the voltage controlled transistor is within the power source voltage of the drive circuit, the drive circuit according to this embodiment is effective also in the range where the switching speed of the voltage controlled transistor is reduced when the both voltages come close to each other.

Seventh Embodiment

In the first and second embodiments, the low level of the drive circuit is fixed at a ground level. One of the effects of the embodiment is that this can be applied to a voltage controlled transistor having a threshold voltage out of the range of the power supply voltage of the drive circuit and that the low level does not have to be always fixed at a ground level.

While certain embodiments have been described, these embodiments have been presented by way of example only, and are note intended to limit the scope of the inventions. Indeed, the novel circuit described herein may be embodied in a variety of other forms; furthermore, various omissions, substitutions and changes in the form of the circuit described herein may be made without departing from the spirit of the inventions. The accompanying claims and their equivalents are intended to cover such forms or modifications as would fall within the scope and spirit of the inventions.

What is claimed is:

1. A resonant gate drive circuit for a voltage controlled transistor which is driven according to a voltage applied to a gate, comprising:

a first switching element and a second switching element connected to a drive circuit power source in series, which are controlled according to a control signal;

a resonant inductor connected to a junction of the first switching element and the second switching element;

a resistor connected to the other terminal of the resonant inductor which is not connected to the first and second switching elements; and a voltage controlled transistor connected to the resistor in a gate;

wherein the voltage controlled transistor is of a normally-on type, a capacitor is provided with one electrode connected to a gate of the normally-on voltage controlled transistor and the other electrode connected to the resistor, and a third diode is provided with an anode connected to the gate of the normally-on voltage controlled transistor and a cathode of the third diode connected to a source of the normally-on voltage controlled transistor.

2. The resonant gate drive circuit for the voltage controlled transistor according to claim 1, wherein the first switching element is delayed from the second switching element by a predetermined time in such a way that the first switching element and the second switching element alternatively turn on/off.

3. The resonant gate drive circuit for the voltage controlled transistor according to claim 1, wherein a single semiconductor device including the normally-on voltage controlled transistor, a capacitor with one electrode connected to the gate of the normally-on voltage controlled transistor and the other electrode connected to the resistor, and a third diode with the anode connected to the gate of the normally-on voltage controlled transistor and with the cathode of the third diode connected to a source of the normally-on voltage controlled transistor, on the same chip like an equivalent circuit, is used as the voltage controlled transistor.

4. The resonant gate drive circuit for the voltage controlled transistor according to claim 3, wherein the capacitor of the semiconductor device is formed by a metal film which is formed on a gate drawing electrode of the normally-on voltage controlled transistor through an insulating film.

5. The resonant gate drive circuit for the voltage controlled transistor gate according to claim 3, wherein a capacity of the capacitor to be connected to the gate is one to nine times more than an input capacity of the normally-on voltage controlled transistor.

6. The resonant gate drive circuit for the voltage controlled transistor according to claim 3, wherein the normally-on voltage controlled transistor is formed by a nitride semiconductor or a wide gap semiconductor of silicon carbide.

* * * * *